United States Patent [19]
Peterson

[11] Patent Number: 5,991,190
[45] Date of Patent: Nov. 23, 1999

[54] QUANTUM RANDOM ADDRESS MEMORY WITH PIEZO READOUT

[75] Inventor: William M. Peterson, Chandler, Ariz.

[73] Assignee: Motorola, Inc., Schaumburg, Ill.

[21] Appl. No.: 09/163,879

[22] Filed: Sep. 30, 1998

[51] Int. Cl.⁶ .................................................. G11C 11/00
[52] U.S. Cl. .......................... 365/151; 365/153; 365/157
[58] Field of Search ................................... 365/151, 153, 365/167, 157, 148, 158, 175

*Primary Examiner*—David Nelms
*Assistant Examiner*—David Lam
*Attorney, Agent, or Firm*—Eugene A. Parsons; William E. Koch

[57] ABSTRACT

A quantum random address memory with piezo readout includes a plurality of address ports providing a low dimensional plurality of addresses, readout structure including a piezo layer with a pair of readout terminals attached thereto, a plurality of nano-memory elements, a plurality of mixer elements coupling either the plurality of address ports or the piezo layer to a high dimensional plurality of the plurality of nano-memory elements, and the other of the plurality of address ports or the piezo layer being coupled to the plurality of nano-memory elements, wherein the high dimensional plurality of nano-memory elements is greater than the low dimensional plurality of addresses.

12 Claims, 4 Drawing Sheets

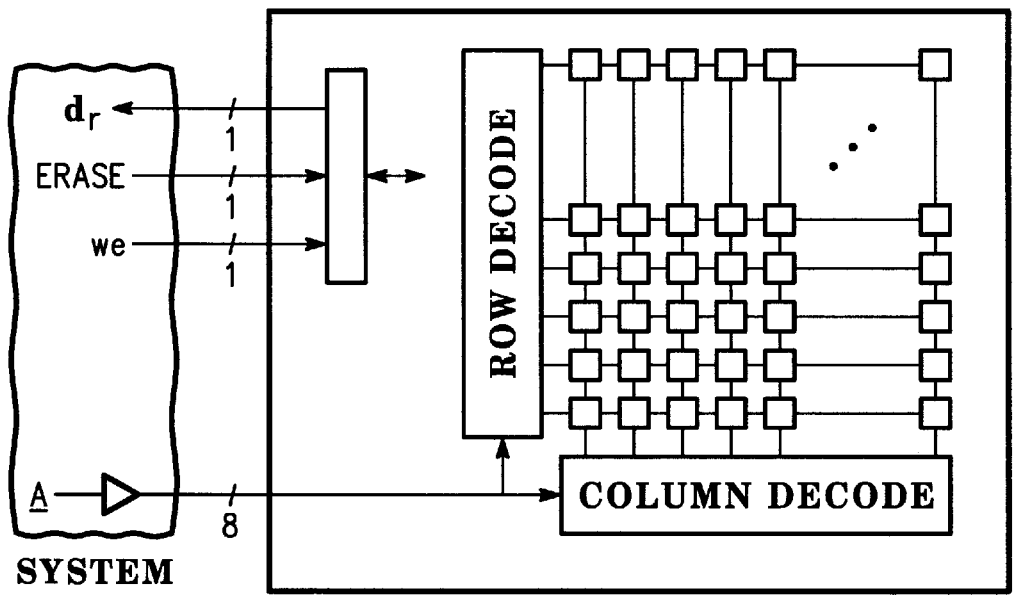
*- PRIOR ART -* FIG. 1
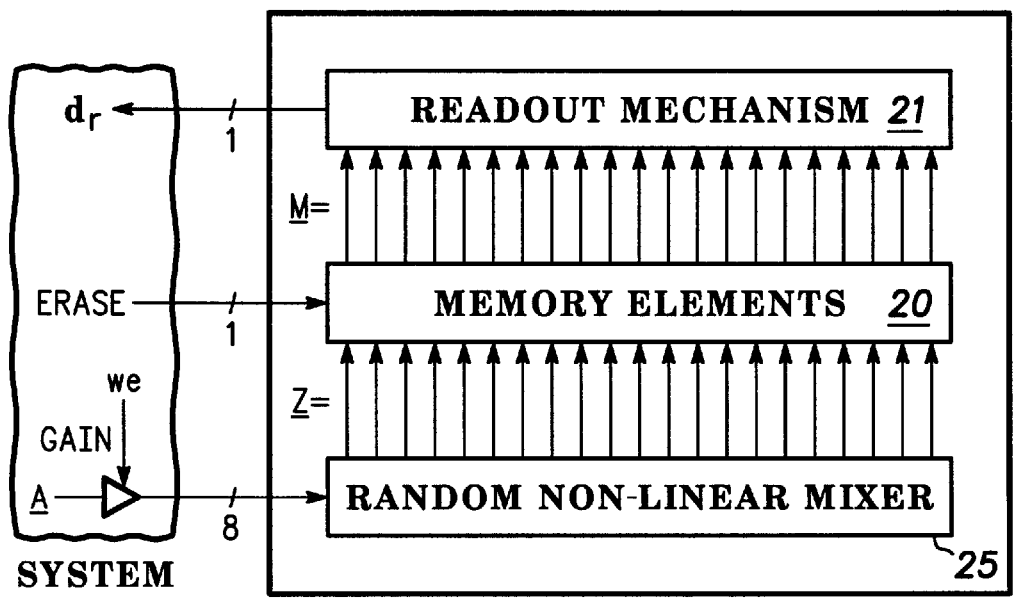
FIG. 2

QUANTUM RANDOM ADDRESS MEMORY WITH PIEZO READOUT

FIELD OF THE INVENTION

The present invention pertains to quantum random address memory apparatus and more specifically to a novel memory with a nano-diode mixer.

BACKGROUND OF THE INVENTION

At the present time memories are utilized in virtually every type of electrical and electronic device to store data, e.g. information, operating instructions, etc. These memories are manufactured in a large variety of types including random access memories (RAM), read only memories (ROM), erasable/programmable memories (EPROM), electronically erasable/programmable memories (EEPROM), to name a few. Also, these various memories are manufactured using a variety of techniques and physical concepts, e.g. magnetic memories, capacitive memories, etc., which are in turn divided into active arrays and passive arrays. Further, at least some of the memories are dense enough to allow up to mega-bytes of information to be stored in a single memory module of practical size.

However, one major problem that is prevalent in all of the prior art memories is the fact that each bit of memory must be addressed individually by means of critically positioned conductors to read (and/or write) information from (or to) the bit. Most conventional memories are intrinsically two dimensional. The usual addressing technique for 2-D memories requires the selection of a row and column port of the array which are common to the selected bit. These rows and columns provide access to localized memory elements that are uniformly distributed in one plane. This results in hundreds of critically positioned conductors (rows, columns and I/O terminals or ports) in conjunction with the large arrays of memory bits making up a large memory. In many instances the I/O ports actually require more chip real estate or area than the array of memory bits. Because present day manufacturing techniques are limited to some type of lithography in the fabrication of the memory arrays and because the line size of the lithography is limited to submicron (generally 0.25 micron), the size of present day memories is quickly reaching an upper limit. This is primarily due to escalating fabrication costs as well as undesired quantum effects. (For example, Professor W. Maly at Carnegie Mellon showed that extrapolations of cost projections in the SIAs 1997 National Technology Roadmap for Semiconductors result in single-die costs as high as $1800 for DRAMS). Further, at room temperature, as the quantized number of electrons per gate approaches one, probability of logic error or memory error increases dramatically.

Yet, the motivation for continued miniaturization is such that all major corporations are conducting research to find nanometer-sized implementations for the logic and memory functions. In the published research literature on such nanometer-sized functions, three major problems remain: unacceptably high error rates at room temperatures; lack of cost effective mass production; and no effective I/O interface with ordinary CMOS logic.

Many or all of these problems are solved or partially solved by quantum random address memory apparatus disclosed in a copending United States Patent Application entitled "Quantum Random Address Memory", filed of even date herewith, bearing attorney docket number CR97-097, and assigned to the same assignee. However, some improvements in the fabrication of various specific components are envisioned herein.

It is a purpose of the present invention to provide new and improved quantum random address memory apparatus.

It is another purpose of the present invention to provide new and improved quantum random address memory apparatus with a mixer that is relatively simple and inexpensive to manufacture.

It is still another purpose of the present invention to provide new and improved quantum random address memory apparatus with random nano-diodes as the mixer elements.

SUMMARY OF THE INVENTION

The above problems and others are substantially solved and the above purposes and others are realized in a quantum random address memory with piezo readout including a plurality of address ports providing a low dimensional plurality of addresses, readout structure including a piezo layer with a pair of readout terminals attached thereto, a plurality of nano-memory elements, a plurality of mixer elements coupling one of the plurality of address ports and the piezo layer to a high dimensional plurality of the plurality of nano-memory elements, and the other of the plurality of address ports and the piezo layer being coupled to the plurality of nano-memory elements. Because of the number of nano-memory elements and mixer elements relative to the number of address ports, the high dimensional plurality of nano-memory elements is greater than the low dimensional plurality of addresses.

Because of the structure and formation of the readout structure, the plurality of nano-memory elements, and the plurality of mixer elements, these components can be constructed with no need for fine detail lithography, as is required in prior art memories.

BRIEF DESCRIPTION OF THE DRAWINGS

Referring to the drawings:

FIG. 1 is a simplified block diagram of a prior art flash memory;

FIG. 2 is a simplified block diagram illustrating various components and their operation in a quantum random address memory in accordance with the present invention;

DESCRIPTION OF THE PREFERRED EMBODIMENTS

Figure 3:
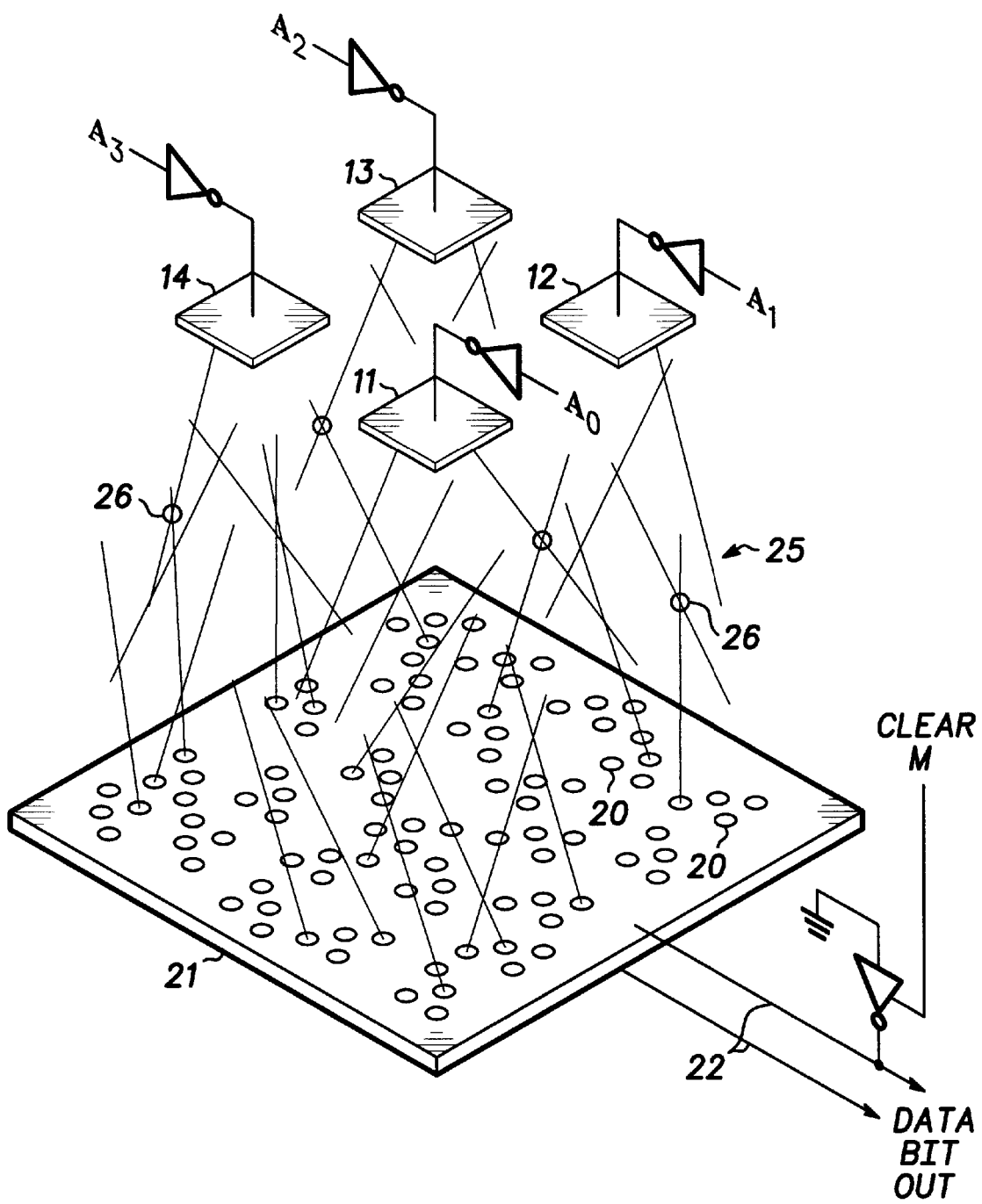
FIG. 3 is a simplified isometric, partial schematic, view of another embodiment of quantum random address memory apparatus with piezo readout in accordance with the present invention.

Turning now to the drawings and specifically to FIG. 1, a prior art 256×1 flash memory is illustrated in simplified block form. The operation of the flash memory will be understood by those skilled in the art and, therefore, will not be explained in detail herein. The conventional flash memory uses spatially independent bit cells by splitting the 256 addresses into 16 rows and 16 columns, as shown in FIG. 1. One cell, capable of storing one bit, is positioned at each row-column intersection so that each cell has a unique row-column intersection at which it can be addressed without effecting any of the other cells. It should be noted however, that the prior art flash memory is a two dimensional device only and utilizing any of the well known present practices requires the use of lithography for the fabrication of every bit. Further, the best that can be cost effectively produced at the present time results in a chip size of approximately 2000 square microns (for 256 bits).

Turning now to FIG. 2, a simplified block diagram/flow chart is provided illustrating various components and their operation in 256×1 quantum random address memory apparatus 10 in accordance with the present invention. The simplified block diagram/flow chart of FIG. 2 is provided only for use in describing the operation and theory of the apparatus 10 and is not intended to describe a complete working structure. Apparatus 10 of FIG. 2 includes eight address ports, $A_0$ through $A_7$, that are illustrated as A and are coupled through eight buffer amplifiers to random nonlinear mixer elements 25. Because of the number of mixer elements 25 and the connections to the eight address ports, as illustrated in FIG. 2, eight address bits (eight conductors) into the system results in 10,000 bits (10,000 conductors) out. The mixer elements 25 are coupled to memory elements 20 which are in turn coupled to readout mechanism 21. While more memory elements may be included, it is assumed that at least 10,000 memory elements 20 are coupled to 10,000 mixer elements 25. Here it should be noted that 10,000 memory elements are utilized because that number yields a substantial noise margin for the (arbitrarily chosen) 256 bit memory capacity, as will be explained presently, as well as a small area of about 4 square microns for a 256×1 bit memory. Thus, apparatus 10 has a total area approximately 500 times smaller than the area of the prior art flash memory illustrated in FIG. 1.

To understand the operating principle of apparatus 10, it should be understood that statistically independent bit cells (hereinafter statcells) are used. First, vector M, which comprises charges on 10,000 nano-memory elements 20, such as polymer molecules, quantum dots, etc., is cleared or randomized. This clears all 256 statcells to the logical '0' state. Now only the statcells that are selected to be logical '1's need to be written. All 256 bits are stored, in a distributed fashion, in the memory vector M. Each nano-memory element in M stores only a small fraction of each of the 256 bits. That is, each whole bit is distributed among all of the 10,000 nano-memory elements of M. This distributed code provides excellent noise and fault tolerance.

For each address A, there is a different random vector $Z_A$ of dimension 10,000. The 10,000 nano-memory elements in each $Z_A$ vector are each +1 or −1. The independence of the 256 statcells is achieved based upon simple probabilities. For example, writing a '1' bit into the statcell corresponding to address A=35 does not change the data bit in the statcell corresponding to address A=36 because it is almost certain that $Z_{35}$ has nearly zero correlation with $Z_{36}$.

To read out the data bit stored in statcell 35, simply measure the degree of similarity between the two patterns M and $Z_{35}$. One way to do this is to threshold the scalar product of $Z_{35}$ and M. For example, if $Z_{35}$ is added to M, then this new M' will be more similar to $Z_{35}$ (i.e. data bit=1) than if the addition had not been done (i.e. data bit=0). Note that the vector or pattern $Z_{35}$ is used as a reference, somewhat like a reference beam in holography or a channel code in CDMA telephony.

To write a '1' data bit to statcell 35, simply add $Z_{35}$ to M. Likewise, to write a '1' data bit to statcell 36, simply add $Z_{36}$ to M. Note that $Z_{35}$ and $Z_{36}$ are added to the same M. The nearly zero correlation keeps the data bits in statcells 35 and 36 separate and independent.

In essence, statcell independence occurs because adding $Z_{35}$ to M adds +1 to a specific $subset_1$, of the elements in and subtracts 1 from the remaining specific $subset_2$ of the elements in M. Now, adding $Z_{36}$ to the same M adds as much as it subtracts from the $subset_1$. Likewise, for $subset_2$. The net effect is zero. When the data bit in statcell 35 is read back or recalled (i.e. M is probed with $Z_{35}$), the pattern similarity measure is essentially unchanged. Thus, writing to statcell 36 does not disturb the data in statcell 35. Note that this independence requires pseudo-random vectors of high dimension (10,000 in this example) for excellent error tolerance.

Referring to FIG. 3, a simplified isometric view is illustrated of quantum random address memory apparatus 10 in accordance with the present invention. Because FIG. 3 illustrates a specific embodiment (greatly simplified) of the apparatus illustrated in simplified block form in FIG. 2, similar components will be designated with similar numbers. Apparatus 10 of FIG. 3 is illustrated in a very simplified mode for purposes of this explanation and it should be understood by those skilled in the art that this figure is not intended to limit the scope of the invention in any way. Apparatus 10 includes eight address ports, $A_0$ through $A_7$ (only four of which are illustrated), that are illustrated as square metal pads 11 through 14 which are each coupled to an externally available terminal through a CMOS buffer (for example only). As will be understood by those skilled in the art, eight address ports results in 256 possible input addresses, assuming a binary system.

Apparatus 10 further includes a plurality of nano-memory elements 20 supported on readout structure, which in this embodiment is a piezo layer 21. Nano-memory elements 20 can be any of a large variety of devices including quantum dots, magnetic tunneling junctions, adaptive resistors, adaptive capacitors, adaptive inductors, adaptive molecules, adaptive resonators, adaptive information couplers, etc., and in this example are quantum dots pseudo-randomly placed on piezo layer 21. Here it should be understood that the highly accurately positioned memory elements of conventional memories are one extreme of the spectrum while totally random memory elements are the other extreme. There is a lot of middle ground between these extremes which can be achieved by biasing the statistics in favor of even more uncorrelated Z vectors. This middle ground is encompassed in the present disclosure in the term "pseudo-random" which is intended to cover everything from totally random to somewhat randomly positioned, as long as the placement does not require fine detail lithography and fine precision alignment. The pseudo-random fabrication and placement of quantum dots is a relatively straight forward process involving the deposition of material and not requiring any fine lithography, fine precision alignment, or the like. An example of one fabrication process for quantum dots is described in U.S. Pat. No. 5,614,435, entitled "Quantum Dot Fabrication Using Strained Epitaxial Growth", issued Mar. 25, 1997. Each quantum dot 20 is three dimensionally limited so that it operates similar to a quantum well and will trap one or more carriers (electrons or holes depending upon the construction) which in turn operate as a stored charge.

Mixer elements 25 are incorporated to couple address ports, $A_0$ through $A_7$, to a high dimensional plurality of nano-memory elements 20. Mixer elements 25 are pseudo-randomly positioned, non-linear electrically conductive elements, such as nano-diodes, self-assembled conductive polymer chains, quantum wires (e.g. strings of metal molecules), or the like. In the event that simple conductors are utilized (e.g. quantum wires) the non-linear condition arises because of a non-linear interaction (see circled junctions designated 26) such as charge gating or modulation. Generally, mixer elements 25 are fabricated by any convenient process that does not require lithography and which results in the pseudo-random distribution or positioning of electrical connections between address ports, $A_0$ through $A_7$, and nano-memory elements 20. Here it should be understood that each of the nano-memory elements 20 are not necessarily connected to one or more of the address ports, $A_0$ through $A_7$. It is only required that a high dimensional plurality of nano-memory elements 20 are connected to a low dimensional plurality of address ports, $A_0$ through $A_7$. Further, the high and low dimensional pluralities are defined such that the high dimensional plurality of nano-memory elements 20 is greater than the low dimensional plurality of address ports, $A_0$ through $A_7$, by a number resulting in substantially error free memory recalls. Through mathematical analysis and extensive testing it has been determined that this number is at least 40, although a smaller number may be utilized in specific applications requiring less accuracy or more tolerant of errors. For example, some applications may include self correcting circuits in which more errors in memory recall can be tolerated. In the above example, with 256 possible addresses, the number of connections between nano-memory elements 20 and mixer elements 25 should be at least 40×256 or approximately 10,000. By using at least 40 times as many connections between nano-memory elements 20 and address ports, $A_0$ through $A_7$, as the number of potential addresses in apparatus 10, up to 20% errors can occur in the connections without a hard error occurring in the data recall, as explained above.

In the specific embodiment illustrated in FIG. 3, the readout mechanism includes piezo layer 21 which has output ports 22 attached thereto for providing a data bit output for each address applied to address ports, $A_0$ through $A_7$. In the embodiment using piezo layer 21 as the readout mechanism, the data bit output is in the form of a voltage pulse at output ports 22 produced by the interaction of the addressed nano-memory elements 20 with the piezo layer 21. This interaction will be described in more detail presently.

Figure 4:
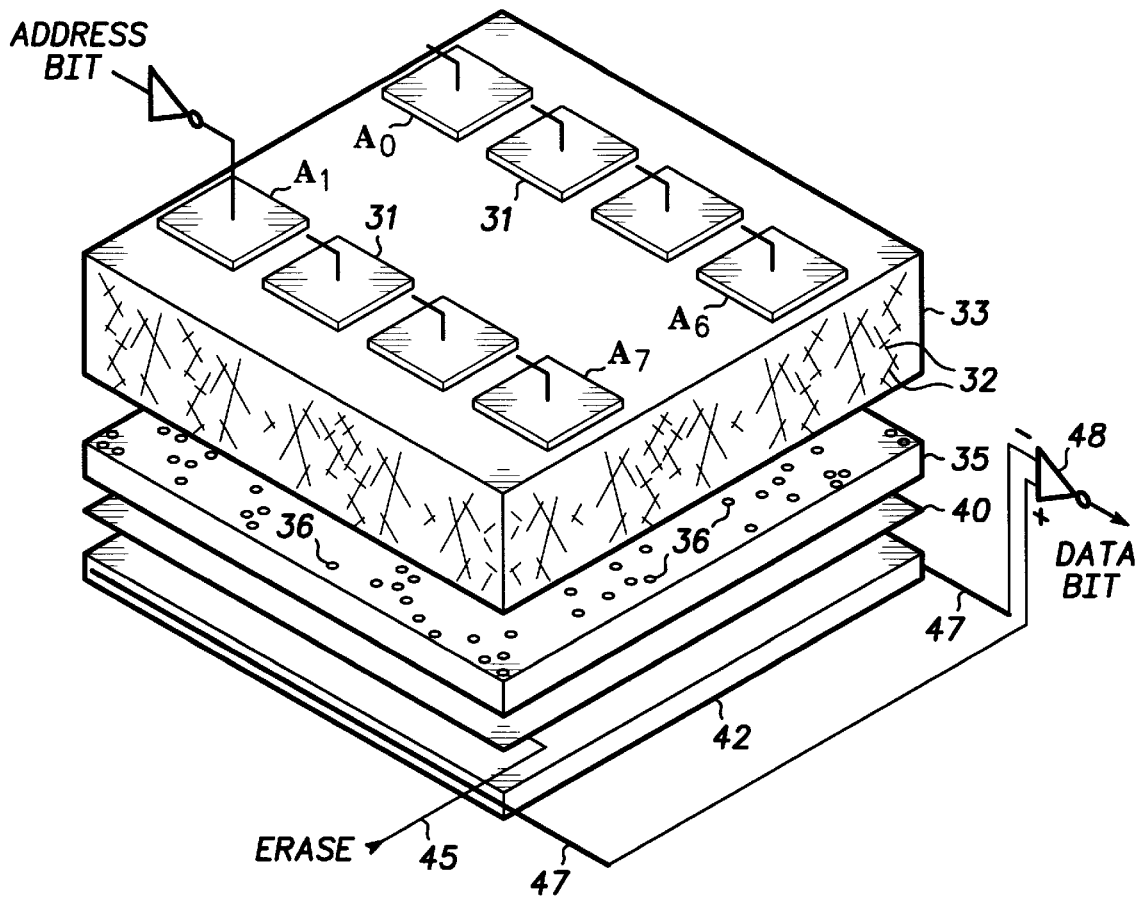
FIG. 4 is a simplified exploded isometric view of another embodiment of quantum random address memory apparatus with piezo readout in accordance with the present invention.

Turning now to FIG. 4, a simplified exploded isometric view is illustrated of another embodiment of quantum random address memory apparatus 30 with piezo readout in accordance with the present invention. Apparatus 30 includes sixteen address ports, designated $A_0$ through $A_7$ (and $-A_0$ through $-A_7$, which are not shown). Generally, A includes eight initial states and the invert, reciprocal, or compliment of each, i.e. the other state among such common pairs as (0,1) or (−1, +1) or (high impedance, low impedance). In this embodiment the address ports are represented by sixteen spaced apart conductive strips (or pads) 31, one strip for each of the address ports, positioned on the upper surface of an insulating layer 33. A plurality of non-linear mixer elements, which in this embodiment include conductors 32, are pseudo-randomly positioned within insulating layer 33. A memory layer 35, including a plurality of nano-memory elements 36 pseudo randomly positioned therein, is positioned on a surface of insulating layer 33 opposite the eight address ports. Nano-memory elements 36 can be any of a large variety of devices including quantum dots, magnetic tunneling junctions, adaptive resistors, adaptive capacitors, adaptive inductors, adaptive molecules, adaptive resonators, adaptive information couplers, etc., and in this example are quantum dots pseudo-randomly placed in memory layer 35.

Mixer elements 32 are non-linear electrically conductive elements, such as nano-diodes, self-assembled conductive polymer chains, quantum wires (strings of metal molecules), or the like, held in place within insulating layer 33. Generally, mixer elements 32 are fabricated by any convenient process that does not require fine detail lithography and fine precision alignment and which results in the pseudo-random distribution or positioning of electrical connections between address ports, $A_0$ through $A_7$, and a plurality of nano-memory elements 36 in memory layer 35. Here it should be understood that each of the nano-memory elements 36 are not necessarily connected to one or more of the address ports, $A_0$ through $A_7$. It is only required that a high dimensional plurality of nano-memory elements 36 are connected to a low dimensional plurality of address ports, $A_0$ through $A_7$. Further, the high and low dimensional pluralities are defined such that the high dimensional plurality of nano-memory elements 36 is greater than the low dimensional plurality of address ports, $A_0$ through $A_7$, by a number resulting in substantially error free memory recalls.

In this embodiment, readout structure includes a thin layer 40 of electrically conductive material positioned on the lower surface of memory layer 35 and a layer 42 of piezoelectric (piezo) material positioned on layer 40. Layer 40 has a lead or terminal 45 attached thereto for the application of an 'erase' signal. A relatively high voltage (or current) applied to terminal 45 significantly alters (e.g. destroys) the previously stored pattern of charge by tunneling (or magnetism by re-magnetization). This erase signal is applied before valid data is to be written. This can be a 'bulk erase' (of all data bits in the memory) or the memory can be partitioned into blocks and erasure can be localized to individual blocks (block erase). Layer 42 of piezo material has a pair of readout leads 46 attached along opposite edges thereof for supplying readout signals to an amplifier 48, which then supplies data bits from memory 30. For a better understanding of the operation of the readout structure reference should be made to FIGS. 5–9 and the description set forth below.

Figure 5:
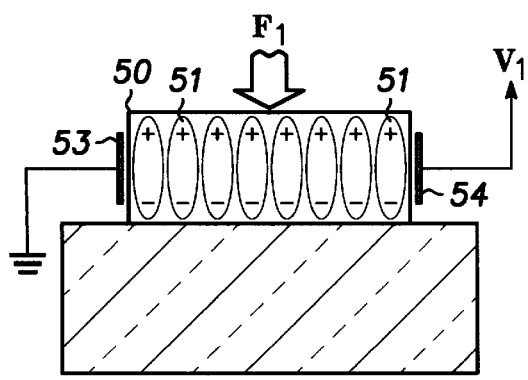
FIG. 5 is a greatly simplified molecular diagram of a first mode for a layer of piezo material.
Figure 6:
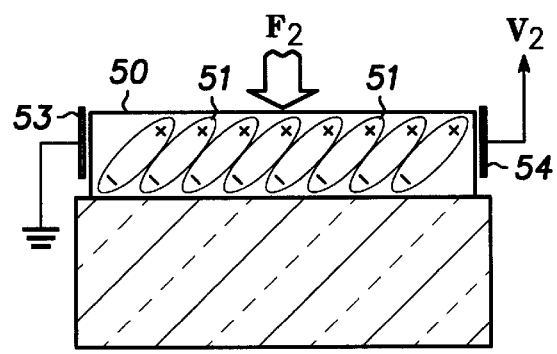
FIG. 6 is a greatly simplified molecular diagram of a second mode for the layer of piezo material illustrated in FIG. 5.

Referring specifically to FIGS. 5 and 6, greatly simplified molecular diagrams are illustrated of first and second modes, respectively, for a layer 50 of piezo material. In a greatly simplified description of piezo voltage generation, when a first force $F_1$ (see FIG. 5), which is either no force or a very small force, is applied to the surface of layer 50 of piezo material the molecules 51 (represented by charged ellipses) remain substantially vertical and no charge appears between terminals 53 (ground) and 54 ($V_1$=0). When a force $F_2$, which is much larger than $F_1$, is applied to the upper surface of layer 50 of piezo material (see FIG. 6), molecules 51 are forced into a position in which terminal 53 becomes negative and terminal 54 becomes positive so that a piezo voltage $V_2$ is generated which is much greater than $V_1$.

Figure 7:
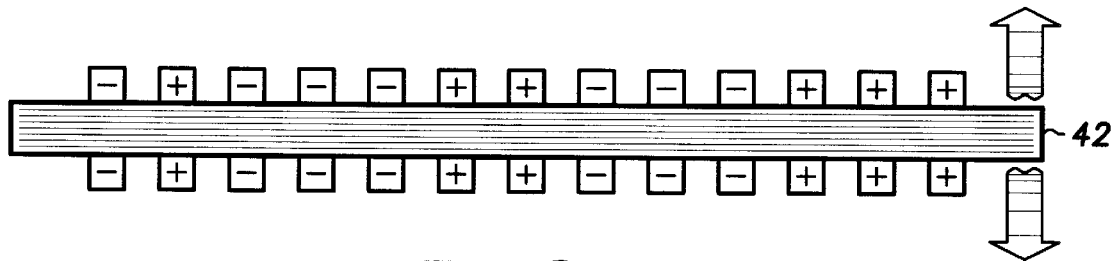
FIGS. 7, 8, and 9 are greatly simplified force piezo diagrams for explaining the operation of the piezo readout structure illustrated in FIG. 4.
Figure 8:
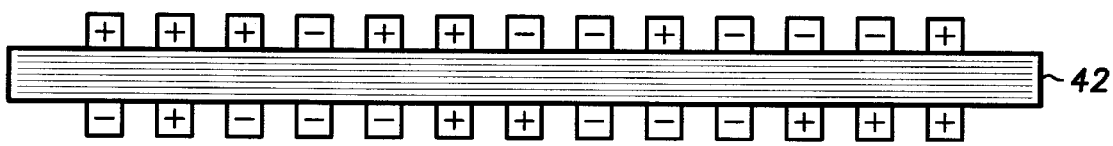
Figure 9:
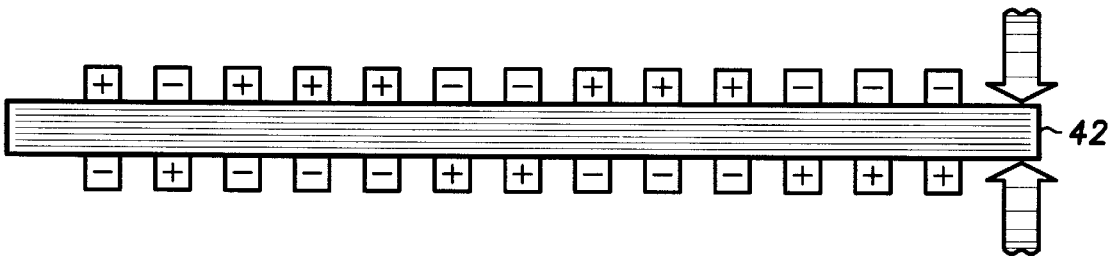

Referring specifically to FIGS. 7–9, the above described principle is applied to layer 42 of piezo material from FIG. 4. In FIGS. 7–9 layer 42 of piezo material is illustrated by itself with electrostatic or electromagnetic fields produced by the associated portion of quantum random address memory apparatus 30 illustrated as small rectangles on opposite surfaces. It should be understood that, while layer 42 of piezo material is illustrated as being positioned adjacent the lower surface of memory layer 35, layer 42 and address ports $A_0$ through $A_7$ could be reversed so that layer 42 is positioned on the upper surface of insulating layer 33. Thus, both mixer elements 32 and nano-memory elements 36 can be positioned to interact (to mutually repel or attract). Since local repulsive or attractive forces are strongest for charges (or magnetic dipoles) in close proximity, 'proximity paired' mixer elements 32 and nano-memory elements 36 contribute the strongest local forces. The rigidity of the layers mechanically sums the local forces to yield a net force. The net force is converted to a voltage (the read-data-output-bit) by the piezo layer. This approximately performs this calculation: c=sum(Z dot M). Alternatively, note that however the net force is established, it can be mechanically transmitted to a somewhat more distant piezo layer (assuming that some other layer can easily expand and contract).

While the electrostatic or electromagnetic fields represented by the small rectangles are illustrated on opposite sides of layer 42 in FIGS. 7–9 it should be understood that the electrostatic or electromagnetic fields could all be on the same side of layer 42 with adjacent pairs of fields having the most effect. Further, the rectangles are designated with a '+' or '−' to indicate a positive field or a negative field on layer 42. For example: if the field produced on layer 42 is electrostatic the '+' indicates a positive charge (+q) and the '−' indicates a negative charge (−q); and if the field produced on layer 42 is electromagnetic the '+' indicates a north-to-center magnetic field (+B) and the '−' indicates a south-to-center magnetic field (−B).

Applying the above principles to a simplified explanation of pattern-match-to-vertical- field operation it will be seen from the following descriptions relating to FIGS. 7–9 that basically three different forces are possible on layer 42 of piezo material for each address of quantum random address memory apparatus 30. Referring specifically to FIG. 7, a case is illustrated in which similar forces are paired with each other so that each field represented by a '+' or '−' rectangle is opposed by a similar field. Thus, a total repulsive force is produced on layer 42. Referring specifically to FIG. 8, a case is illustrated in which some similar fields are paired with each other so that some of the fields represented by a '+' or '−' rectangle are opposed by a similar field and some of the fields are paired with an opposite field to produce attractions which offset the repulsions. Thus, a total balanced force (F=0) is produced on layer 42. Referring specifically to FIG. 9, a case is illustrated in which all fields are paired with opposite fields so that each field represented by a '+' or '−' rectangle is complemented by a '−' or '+' field, respectively. Thus, a total attractive force is produced on layer 42.

Referring again to FIG. 4, as each address port $A_0$ through $A_7$ is selected in a read process, an electrostatic pattern is generated on layer 42 of piezo material. The electrostatic pattern for each address port will be one of the three cases described above. In the specific embodiment illustrated one volt (or zero volts) is applied to each address port $A_0$ through $A_7$ (and to −A0 through −A7) to write data in the memory and 0.1 (or zero volts) volts are used to read the data.

Thus, a new and improved quantum random address memory is disclosed which incorporates new and novel piezo readout structure. The quantum random address memory with piezo readout is relatively simple and inexpensive to manufacture and has virtually no upper limits on the size, or number of bytes it can store. Also, the quantum random address memory with piezo readout is highly manufacturable and does not require lithography to produce the mixer elements, the nano-memory elements, or the readout structure but is still much smaller than prior art memories. For example, the 256×1 random access memory illustrated in FIG. 4 uses approximately 2 microns by 2 microns of area.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A quantum random address memory with piezo readout comprising:

a plurality of address ports providing a low dimensional plurality of addresses;

readout structure including a piezo layer with a pair of readout terminals attached thereto;

a plurality of nano-memory elements;

a plurality of mixer elements coupling one of the plurality of address ports and the piezo layer to a high dimensional plurality of the plurality of nano-memory elements; and the other of the plurality of address ports and the piezo layer being coupled to the plurality of nano-memory elements, wherein the high dimensional plurality of nano-memory elements is greater than the low dimensional plurality of addresses.

2. Quantum random address memory apparatus with piezo readout as claimed in claim 1 wherein the high dimensional plurality of nano-memory elements is greater than the low dimensional plurality of addresses by at least a factor of 40.

3. Quantum random address memory apparatus with piezo readout as claimed in claim 1 wherein the plurality of nano-memory elements are pseudo-randomly placed on a support structure.

4. Quantum random address memory apparatus with piezo readout as claimed in claim 3 wherein the nano-memory elements each include one of quantum dots, magnetic tunneling junctions, and resistors.

5. Quantum random address memory apparatus with piezo readout as claimed in claim 1 wherein the mixer elements are pseudo-randomly positioned, non-linear elements.

6. Quantum random address memory apparatus with piezo readout as claimed in claim 5 wherein the mixer elements each include one of pseudo-randomly placed nano-diodes and self-assembled conductive polymer chains.

7. Quantum random address memory apparatus with piezo readout as claimed in claim 1 wherein the plurality of address ports include spaced apart conductive strips, one strip for each of the address ports.

8. Quantum random address memory apparatus with piezo readout as claimed in claim 1 wherein the data output structure further includes a layer of material sandwiched between the nano-memory elements and the piezo layer.

9. Quantum random address memory apparatus with piezo readout as claimed in claim 8 wherein the layer of material sandwiched between the nano-memory elements and the piezo layer is electrically conductive and has an electrical terminal attached thereto for supplying an 'erase' signal to the data output structure.

10. Quantum random address memory apparatus with piezo readout as claimed in claim 8 wherein the readout structure further includes a layer of material sandwiched between the memory layer and the layer of piezo material.

11. Quantum random address memory apparatus with piezo readout as claimed in claim 10 wherein the layer of material sandwiched between the memory layer and the layer of piezo material is electrically conductive and has an electrical terminal attached thereto for supplying an 'erase' signal to the readout structure.

12. Quantum random address memory apparatus with piezo readout comprising:

a plurality of address ports providing a low dimensional plurality of addresses;

a plurality of nano-memory elements randomly placed in a memory layer on a support structure;

pseudo-randomly positioned, non-linear mixer elements coupling the address ports to a high dimensional plurality of the plurality of nano-memory elements;

readout structure including a layer of piezo material positioned adjacent the memory layer so as to couple the plurality of nano-memory elements to the piezo layer for detecting a readout pattern of the plurality of nano-memory elements for each address applied to the plurality of address ports; and data output ports coupled to the readout structure for providing an output signal for each address applied to the plurality of address ports, wherein the high dimensional plurality of nano-memory elements is greater than the low dimensional plurality of addresses by a number resulting in substantially error free memory recalls.

\* \* \* \* \*